United States Patent [19]
Ruth et al.

[11] Patent Number: 6,035,015
[45] Date of Patent: *Mar. 7, 2000

[54] COMPTON BACKSCATTERED COLLMATED X-RAY SOURCE

[75] Inventors: Ronald D. Ruth, Woodside; Zhirong Huang, Stanford, both of Calif.

[73] Assignee: The Board of Trustees of the Leland Stanford Junior University, Palo Alto, Calif.

[ * ] Notice: This patent is subject to a terminal disclaimer.

[21] Appl. No.: 09/146,202

[22] Filed: Sep. 2, 1998

Related U.S. Application Data

[63] Continuation of application No. 08/910,816, Aug. 13, 1997, Pat. No. 5,825,847.

[51] Int. Cl.⁷ .................................................. H01J 35/14
[52] U.S. Cl. ............................................ 378/119; 378/138
[58] Field of Search .................................... 378/119, 120, 378/121, 137, 138

[56] References Cited

U.S. PATENT DOCUMENTS

| | | | |
|---|---|---|---|
| 3,813,555 | 5/1974 | Viecelli | 378/119 X |
| 3,879,679 | 4/1975 | Mourier | 331/94.5 N |
| 3,886,366 | 5/1975 | Kash | 250/493 |
| 4,598,415 | 7/1986 | Luccio et al. | 378/119 |
| 4,975,917 | 12/1990 | Villa | 372/5 |
| 5,077,774 | 12/1991 | Piestrup et al. | 378/179 |
| 5,197,071 | 3/1993 | Yamada | 372/2 |
| 5,227,733 | 7/1993 | Yamada | 328/234 |
| 5,247,562 | 9/1993 | Steinbach | 378/119 |
| 5,353,291 | 10/1994 | Sprangle et al. | 372/5 |
| 5,495,515 | 2/1996 | Imasaki | 378/119 |
| 5,701,317 | 12/1997 | Yu et al. | 378/119 X |
| 5,825,847 | 10/1998 | Ruth et al. | 378/119 |

FOREIGN PATENT DOCUMENTS 0 105 032  4/1984  European Pat. Off. .

OTHER PUBLICATIONS

Huang, et al., "Laser–Electron Storage Ring", *Phys. Rev. Lett.*, vol. 80, No. 5, pp. 976–979 (Feb. 2, 1998).

Zholents, et al., "A proposal for the generation of ultra–short X–ray pulses", *Nuclear Instruments and Methods in Physics Research*, A 358 (1995), pp. 455–458.

Pellegrini, Claudio, "Applications of Short Bunches", *American Institute of Physics* (1996).

Spencer, J.E., "Present Optics Options for TeV Colliders", Stanford Linear Accelerator Center, pp. 526–530.

Pogorelsky, I.V., "Prospects for Compact High–Intensity Laser Synchrotron X–Ray and Gamma sources", *Advanced Accelerator Concepts*, CP398, Ed. S. Chattopadhvav, J. McCullough, and P. Dahl, AIP Press, NY (1997), pp. 951–965.

(List continued on next page.)

*Primary Examiner*—David P. Porta
*Attorney, Agent, or Firm*—Flehr Hohbach Test Albritton & Herbert LLP

[57] ABSTRACT

A high-intensity, inexpensive and collimated x-ray source for applications such as x-ray lithography is disclosed. An intense pulse from a high power laser, stored in a high-finesse resonator, repetitively collides nearly head-on with and Compton backscatters off a bunched electron beam, having relatively low energy and circulating in a compact storage ring. Both the laser and the electron beams are tightly focused and matched at the interaction region inside the optical resonator. The laser-electron interaction not only gives rise to x-rays at the desired wavelength, but also cools and stabilizes the electrons against intrabeam scattering and Coulomb repulsion with each other in the storage ring. This cooling provides a compact, intense bunch of electrons suitable for many applications. In particular, a sufficient amount of x-rays can be generated by this device to make it an excellent and flexible Compton backscattered x-ray (CBX) source for high throughput x-ray lithography and many other applications.

11 Claims, 4 Drawing Sheets

OTHER PUBLICATIONS

Sprangle, P., et al., "Tunable, Short Pulse Hard X–Rays From a Compact Laser Synchrotron Source", *J. Appl. Phys.* 72 (11), Beam Physics Branch, Plasma Physics Division, Naval Research Laboratory, Washington, DC 20375–5320, accepted for publication Aug. 11, 1992; Dec. 1, 1992; pp. 5032–5038.

Chen, J., et al., "Development of a Compact High Brightness X–Ray Source", Nuclear Instruments and Methods in Physics Research A 341 (1994), North Holland; pp. 346–350.

Sprangel, P., et al., "New X–Ray Source for Lithography", *Appl. Phys. Lett.;* 55 (24), Naval Research Laboratory, Washington, D.C. 20375–5000, accepted for publication Sep. 27, 1989); Dec. 11, 1989; pp. 2559–2560.

Telnov, Valery, "Laser Cooling of Electron Beams for Linear Colliders"; *Physical Review Letters –The American Physical Society*; vol. 78, No. 25; Institute of Nuclear Physics, 630090 Novosibirsk, Russia Jun. 23, 1997; pp. 4757–4760.

Pogorelsky, I.V., et al.; "Emerging Terawwatt Picosecond $Co_2$ Laser Technology and Possible Applications in Accelerator Physics", NSLS, BNL, Upton, NY 11973 USA, PAC'97 Proceedings.

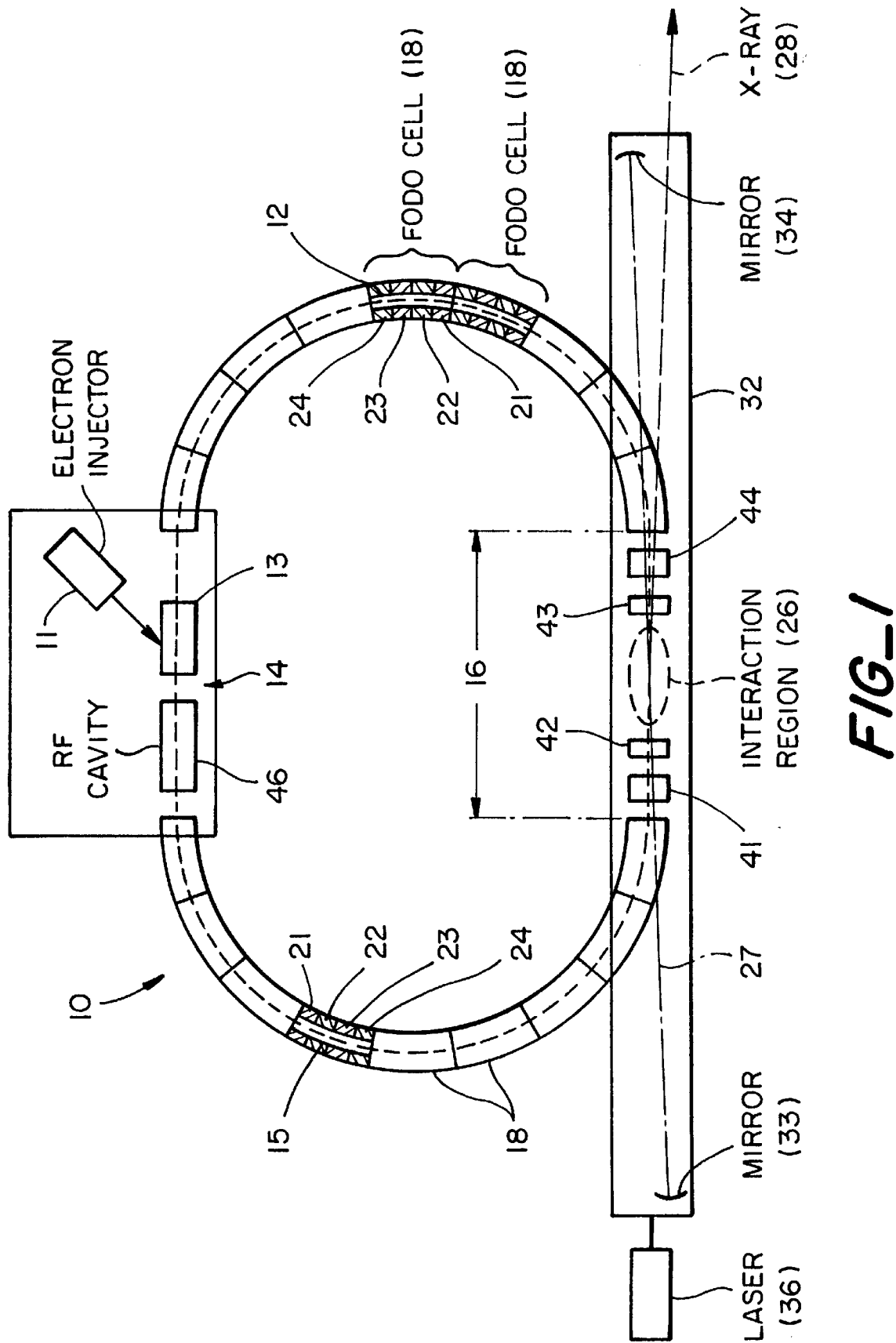
FIG_1

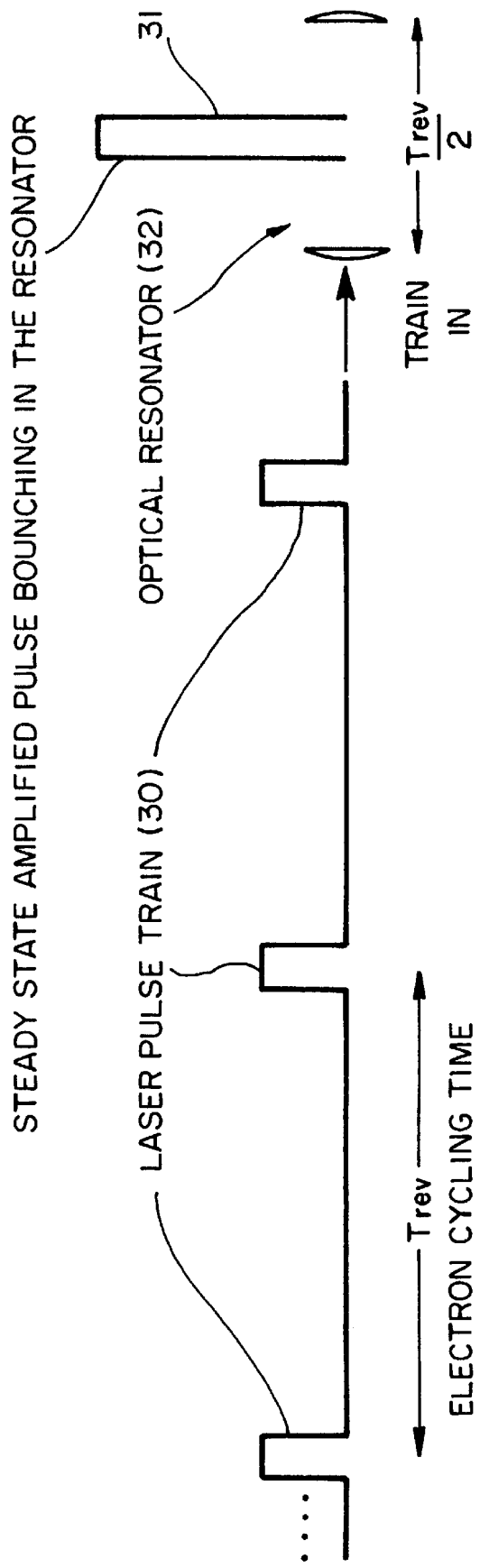
FIG_2

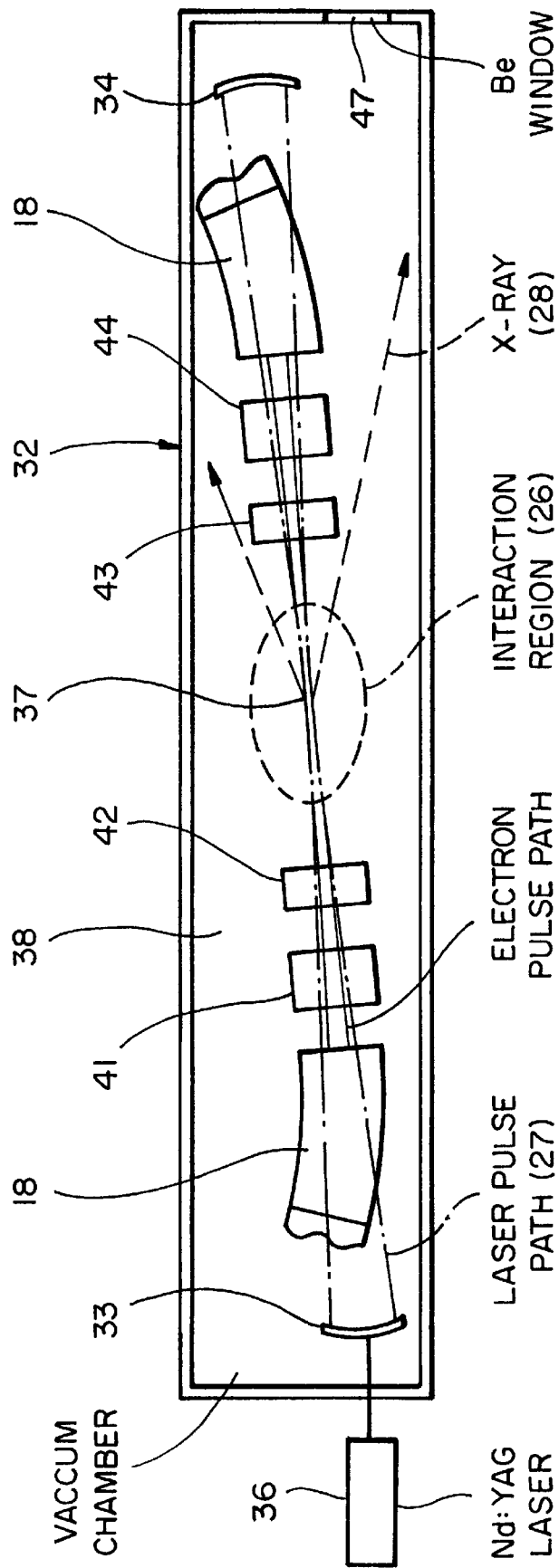
FIG_3

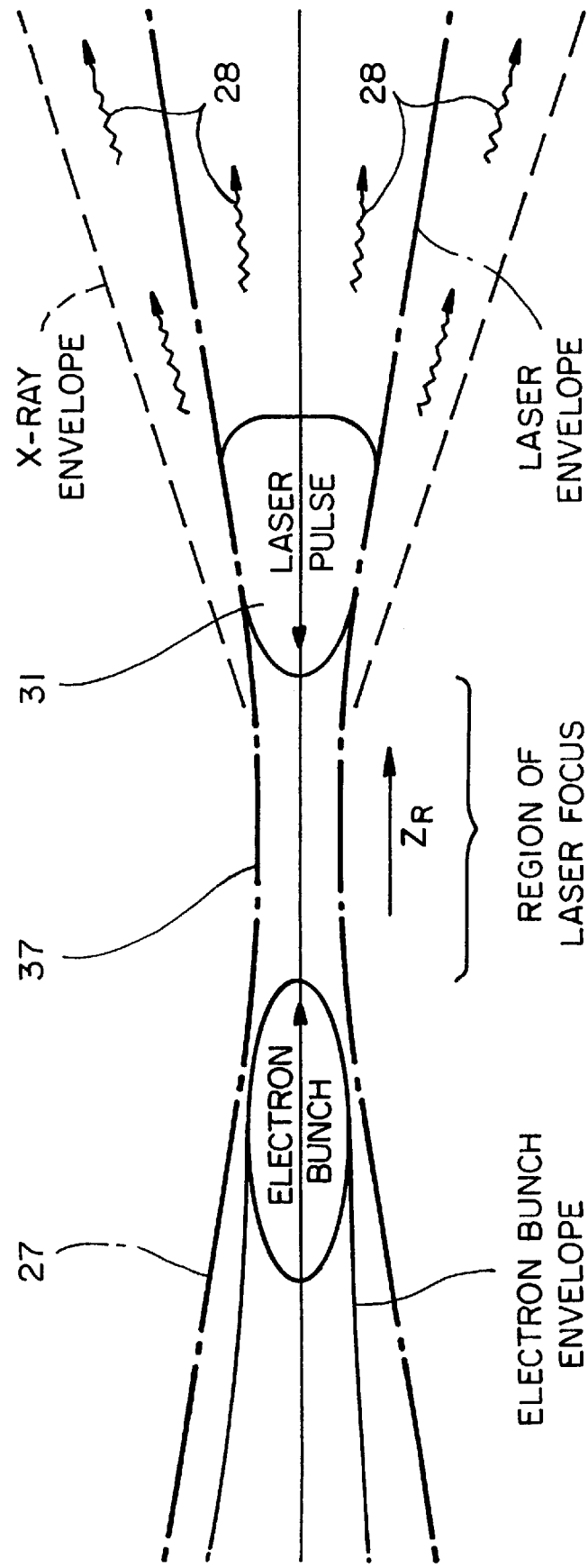
FIG_4

COMPTON BACKSCATTERED COLLMATED X-RAY SOURCE

RELATED APPLICATION

This application is a continuation of application Ser. No. 08/910,816 filed Aug. 13, 1997 now U.S. Pat. No. 5,825,847.

GOVERNMENT SUPPORT

This invention was made with Government support under Contract No. DE-AC03-76SF00515 awarded by the Department of Energy. The Government has certain rights to this invention.

FIELD OF THE INVENTION

The present invention is a high-intensity, inexpensive, Compton backscattered, collimated, x-ray source produced by a cooled electron bunch in a compact storage ring repetitively colliding with a high power laser beam in an optical resonator.

BACKGROUND OF THE INVENTION

In the past two decades x-ray lithography (XRL) has been developed as an alternative to optical lithography as feature sizes of silicon chips continue to shrink according to the Moore's law (*S.P.I.E. Symp. Proceedings* "Electron Beam, X-ray, and Ion-Beam Submicrometer Lithographies for Manufacturing", 1990–1996). Today, optical lithography is reaching some fundamental limits, and x-ray lithography is emerging as the primary successor technology needed for future lithography development. The two biggest challenges facing x-ray lithography are perhaps the fabrication of x-ray masks and the development of the x-ray sources. While the technology of mask patterning is evolving by means of electron beam lithography and advances in material science, economical exposure sources are still lacking. At present there are three types of x-ray sources that could provide sufficient flux for a reasonable exposure time (*S.P.I.E. Symp. Proceedings* "Electron Beam, X-ray, and Ion-Beam Submicrometer Lithographies for Manufacturing", 1990–1996): synchrotrons, plasma-based sources, and transition radiation (TR) sources. Among these, plasma-based sources are relatively easy to obtain but have the lowest available x-ray power level and no collimation. TR sources employ moderate energy electron linacs (25 MeV to 250 MeV) to bombard a stack of thin Beryllium (Be) foils. The resulting x-ray beam is well collimated but hollow in the forward direction. Special methods of making the cross section of the x-ray beam uniform and eliminating the background radiation are needed. Synchrotrons, on the other hand, are the preferred sources because they are powerful and stable. However, in order to generate x-rays having the optimal wavelength for XRL (around 1 nm), synchrotrons operate with high-energy electron beams (around 1 GeV when using conventional magnets and even 600 MeV when using superconducting dipoles). Hence the entire system (synchrotron, injector and radiation shielding) can be very expensive and complex. In addition, special beam lenses and steppers are necessary to facilitate wafer production, which translates to a huge initial investment for manufacturers.

There are a number of sources of x-rays which depend upon Compton Scattering. Compton scattering is a phenomenon of elastic scattering of photons and electrons. Since both the total energy and the momentum are conserved during the process, scattered photons with much higher energy (light with much shorter wavelength) can be obtained in this way. A laser beam collides nearly head-on with and is scattered off a high energy electron beam in order to generate x-rays (or even gamma-rays) for various applications. If $\lambda_L$ is the laser wavelength, $\gamma$ is the electron energy in units of its rest mass $m_e c^2$, and $\theta$ is the angle of the scattered x-ray photon with respect to the direction of the electron trajectory, then the wavelength of the scattered photon is $$\lambda_x = \frac{(1+\gamma^2\theta^2)\lambda_L}{4\gamma^2}. \tag{1}$$

These x-rays are naturally collimated around the forward direction of the electrons within an opening angle of $1/\gamma$ due to the relativistic effect.

However, the total cross section of the Compton scattering is quite small, and is approximately given by the Thomson cross section when the energy of the scattered photon is much lower than the electron energy:

$$\sigma = \frac{8}{3}\pi r_e^2 \approx 6.66\times 10^{-29}\, m^2, \tag{2}$$

where $r_e = 2.82\times 10^{-15}$ m is the classical electron radius. Suppose that $N_e$ number of electrons encounters $N_L$ number of photons with a common geometrical cross section A at an interaction rate f. Then the total number of scattered x-ray photons per unit time can be written as:

$$\dot{N} = \frac{\sigma}{A} N_e N_L f. \tag{3}$$

From Eq. (3), we conclude that in order to obtain a significant x-ray flux, it is desirable to have both a high intensity photon beam and a high current electron beam along with a high interaction rate. Pat. Nos. 3,886,366; 4,598,415; 4,975,917; 5,247,562; 5,353,291; and 5,495,515, and the following articles: P. Sprangle et al., *J. Appl. Phys.* 72, 5032–5038 (1992), and J. Chen et al., *Nucl. Instr. and Meth. in Phys. Res.* A 341, 346–350 (1994), describe Compton scattered x-ray sources. The prior art apparatus for producing intense x-rays usually involve the use of a high-power, pulsed laser (either a solid-state laser with about 1 $\mu$m wavelength or a gas CO2 laser with about 10 $\mu$m wavelength) and an intense electron beam source from pulsed linacs, betatrons or storage rings. Lasers with short pulses are preferred because they can be focused to very small spots over the entire pulse length during the desired collision. Long pulse lasers or CW lasers such as in Pat. No. 5,247,562 when focused to a very small spot form a waiste-like shape so that the transverse area is large over much of the laser pulse length. In order for the laser pulse to be very small during the collision process, the laser pulse length (as well as the electron bunch length) must be smaller than, or on the order of, the depth of focus (or Rayleigh range) of the optical resonator. Some devices also employ a photon accumulating cavity such as a Fabry-Perot resonator (Pat. Nos. 4,598,415 and 5,495,575) or a ring cavity (Pat. No. 5,353,291) to build up the laser intensity.

Nevertheless, for applications in high throughput x-ray lithography, which require an average x-ray flux on the order of $10^{14} \sim 10^{15}$ photons per second with their wavelengths around 1 nm, the repetition rate from a single-pass accelerator such as a linac of about 100 Hz is found to be too low, and hence the devices of Pat. No. 3,886,366 (an electrodynamics linac), Pat. No. 4,975,917 (a pulsed power linac), Pat. No. 5,353,291, and P. Sprangle et al., *J. Appl. Phys.* 72, 5032–5038 (1992) (an rf linac) are not satisfactory sources. On the other hand, a multiple-pass accelerator such as an electron storage ring, which does have a high enough repetition rate (more than 1 MHz), operates well at high energies but suffers beam instabilities at lower energies. Since the optimal wavelength of XRL is a factor of a thousand or ten thousands times shorter than the laser wavelengths, the energy of the electrons in the storage ring necessary to boost the laser photon energy by the same factor is 8 MeV (when using a solid-state laser) or 25 MeV (when using a CO2 laser). At either energy range, the number of electrons must be kept very low in order to avoid any beam instability. Thus, the x-ray yield is far from adequate, as in the cases of Pat. No. 4,598,415 and J. Chen et al., *Nucl. Instr. and Meth. in Phys. Res.* A 341, 346–350 (1994). The betatron of Pat. No. 5,353,291 has a high repetition rate but results in a continuous electron beam so that only a tiny fraction of the beam interacts with the desired short laser pulse. Thus, the x-ray yield is again far from adequate.

There are also proposals for employing a quasi-optical maser cavity to accumulate the electromagnetic radiation and/or to enhance the interaction rate for higher x-ray flux (Pat. No. 5,227,733). Both these methods use a millimeter wave source to scatter off a higher energy electron beam from a storage ring. However, millimeter wave sources have neither the power level nor the bunch compression schemes offered by solid-state lasers. Thus, they are not as favorable and convenient as using lasers for x-ray generation.

SUMMARY OF THE INVENTION

It is a general object of the present invention to provide a substantially improved Compton backscattering device for achieving an intense beam of x-rays.

Another object of the present invention to cool the electrons in a compact storage ring to provide a compact, intense electron bunch which can be used in many applications.

Another object of the present invention is to provide an intense beam of x-rays at the correct wavelength to yield a practical x-ray lithography source that is compact, inexpensive, requires low power and limited radiation shielding.

Another object of the present invention is to provide a source of electron bunches with very low emittance for use in applications requiring low emittance such as Free Electron Lasers.

An intense pulse from a high power laser, stored in a high-finesse resonator, repetitively collides nearly head-on with and Compton backscatters off a tightly bunched electron beam, having relatively low energy and circulating in a compact storage ring. Both the laser and the electron beams are tightly focused and matched at the interaction region inside the optical resonator. The laser-electron interaction not only gives rise to x-rays at the desired wavelength, but also provides rapid cooling and stability in all three degrees of freedom, relative to a central particle in the bunch, to maintain the intense compact bunch of electrons so that all electrons participate in each laser pulse collision. The terms "cooling" and "to cool" indicate this process throughout this patent. Laser pulse length and size, electron bunch length and size, and their relative timing and synchronism are chosen so that each electron in the electron bunch transverses the oncoming laser pulse when it is substantially at its smallest cross section and highest intensity. Thus, a sufficient amount of x-rays can be generated to make the inventive Compton backscattered x-ray source an excellent and flexible x-ray source for high throughput x-ray lithography and many other applications.

DESCRIPTIONS OF THE DRAWINGS

The invention will be clearly understood from a reading of the following description in conjunction with the accompanying drawings.

FIG. 1 is a schematic diagram of a Compton backscattered x-ray source in accordance with the present invention.

FIG. 2 shows the laser pulse timing and the accumulated laser or photon pulse in the resonator.

FIG. 3 is a schematic showing the setup of the laser-electron interaction region.

FIG. 4 is an enlarged schematic view of the laser-electron beam interaction region.

DETAILED DESCRIPTION OF THE INVENTION AND PREFERRED EMBODIMENTS

The x-ray source, FIG. 1, includes a compact electron storage ring 10 into which and electron bunch, injected by an electron injector 11, is introduced by septum or kicker 13. The compact storage ring 10 includes c-shaped metal tubes 12, 15 facing each other to form gaps 14, 16. An essentially periodic sequence of identical FODO cells 18 surround the tubes 12, 15. As is well known, a FODO cell comprises a focusing quadrupole 21, followed by a dipole 22, followed by a defocusing quadrupole 23, then followed by another dipole 24. The magnets can be either permanent magnets (very compact, but fixed magnetic field) or electromagnetic in nature (field strength varies with external current). The FODO cells keep the electron bunch focused and bend the path so that the bunch travels around the compact storage ring and repetitively travels across the gap 16. As an electron bunch circulates in the ring and travels across a gap 16, it travels through an interaction region 26 where it interacts with a photon or laser pulse which travels along path 27 to generate x-rays 28 by Compton backscattering. The metal tubes may be evacuated or placed in a vacuum chamber.

The electron cycling time is $T_{rev}$ at the same time a train of laser pulses 30, FIGS. 2 and 4, is matched into a highly reflective optical resonator 32 to build up an intense pulse 31, FIG. 4. The resonator may comprise highly reflecting mirrors 33 and 34 spaced by $T_{rev}/2$ to yield a resonator period $T_{rev}$ with a pulsed laser 36 injecting photon pulses into the resonator. At steady state, the power level of the accumulated laser or photon pulse 31 in the resonator can be maintained because any internal loss is compensated by the sequence of synchronized input laser pulses 30 from laser 36. The laser pulse repetition rate is chosen to match the time $T_{rev}$ it takes for the electron beam to circulate once around the ring and the time for the photon pulse to make one round trip in the optical resonator. The electron bunch and laser or photon pulse are synchronized so that the light beam pulses repeatedly collide with the electron beam at the focus region 37 of the optical resonator. The interaction takes place in vacuum chamber 38, FIG. 3, that encloses the optical resonator.

Special bending and focusing magnets 41, 42, and 43, 44, are provided to focus and steer the electron bunch for interaction with the photon pulse, and to shrink the electron beam size inside the vacuum chamber in order to overlap the electron bunch with the tiny spot size of the laser beam pulse. The optical resonator may be slightly tilted in order not to block the x-rays 28 in the forward direction, FIG. 3. The FODO cells 18 and the focusing and bending magnets 41, 42 and 43, 44 are slotted to permit bending and passage of the laser pulses and x-ray beam into and out of the interaction region 26. As the electron beam circulates around the ring, the energy lost to the x-rays is restored by an rf accelerating cavity 46 as in a normal storage ring. In addition, the rf field serves as a focusing force in the longitudinal direction to confine the electron beam with a bunch length comparable to the laser pulse length.

In a storage ring with moderate energy, it is well-known that the Coulomb repulsion between the electrons constantly pushes them apart in all degrees of freedom and also gives rise to the so-called intra-beam scattering effect (one single electron scatters off another single electron). Thus, a pure storage ring with a relatively low energy but an intense electron beam is unstable. However, by inserting a tightly focused laser-electron interaction region 26 in the storage ring, each time the electrons lose energy to the scattered photons that on the average follow the electron trajectories, they move closer in phase space (the space that includes information on both the position and the momentum of the electrons), i.e., the electron beam becomes "cooler" since the random thermal motion of the electrons within the beam is less. This laser cooling is more pronounced when the laser pulse inside the optical resonator is made more intense, and is used to counterbalance the natural quantum excitation and the strong intra-beam scattering effect when an intense electron beam is stored. Therefore, the electron beam can be stabilized by the repetitive laser-electron interactions, and the resulting x-ray flux is significantly enhanced.

Following Eq. (3), we can determine the x-ray flux as a function of laser and resonator parameters. Assume that the average power of the laser is $P_L$ and the total mirror reflectivity of the optical resonator is R, so that the average power inside the resonator can be as high as $P_L/(1-R)$. If the Rayleigh range (the depth of the focus) of the optical resonator is $Z_R$, then the laser focal spot area is $A=Z_R \lambda_L$. The total number of x-ray photons produced per unit time is $$\dot{N}_x = \frac{4}{3} N_e \frac{r_e^2}{Z_R \hbar c} \frac{P_L}{(1-R)}, \quad (4)$$

where $\hbar c = 1.97 \times 10^{-7}$ eV m.

As an illustration for applications in x-ray lithography, suppose that we use a 100 W average power mode-locked Nd:YAG laser (wavelength 1 μm, pulse length~10 psec, pulse separation~10 nsec). This laser is then matched into a Fabry-Perot resonator with Rayleigh range $Z_R=4$ mm and mirror reflectivity R=99.99%. When focused to a spot size of 35 μm in radius and interacting with a matched electron beam (energy~8 MeV, $1 \times 10^{10}$ electrons per bunch, bunch length~4 mm) from a 0.5 m average radius storage ring, $9 \times 10^{14}$ x-ray photons per second are generated along the forward direction of the electron trajectory over an opening angle of 64 mrad. If the laser beam is slightly tilted with respect to the electron beam direction at the interaction region by $\Delta\theta = 35$ μm/4 mm=8.75 mrad (see FIGS. 3 and 4), one can collect the scattered x-rays in the forward direction from 0 to 25 mrad through a thin Beryllium window 47, FIG. 3 (which is transparent to x-rays). Due to the angular dependence of the x-ray wavelength (see Eq. (1)), the bandwidth of the collected x-rays is $$\frac{\Delta\lambda}{\lambda} = (\gamma \Delta \theta)^2 = 16\%, \quad (5)$$

i.e., the wavelengths of these x-rays are between 1.2 nm and 1 nm. Thus, at a distance 1 m away from the interaction point, a field size of 25 mm in diameter can be uniformly (<5% variation) illuminated by these x-rays. The power density is estimated to be on the order of 10 mW/cm², which is adequate for high throughput XRL.

From the above discussion, we see that the CBX source we describe here is naturally tuned around the optimal XRL wavelength instead of having the broadband spectrum found in all other existing sources. The necessary electron energy is about one order of magnitude lower than that of TR sources, and two orders of magnitude lower than that of standard synchrotrons. Thus, the storage ring can be made extremely compact with permanent magnet technology, and both the electron injector and radiation shielding are much easier than for TR and synchrotron sources. The CBX source can be also very efficient, with both the storage ring and the laser pump operating most likely in the multi-KW power range. Unlike the three existing XRL sources, no exotic beam line (or scan or collimation optics) is required for x-rays generated from the CBX source. It is also conceivable to orient the storage ring and laser resonator in the vertical direction so that the traditional wafer production facilities can be adapted to XRL manufacturing. Therefore, the CBX source may enable the semiconductor industry to make a much smoother transition from optical lithography to x-ray lithography.

By adjusting the field strength of electromagnetic dipoles and quadrupoles in the storage ring, the energy of the electrons can be varied without changing the geometry of the ring. Thus, the Compton source is completely tunable and can be extended to cover both soft x-ray and hard x-ray ranges. We prefer to use solid-state lasers because of the existence of pulse compression techniques combined with high average power developments. Nevertheless, recent progress in picosecond $CO_2$ lasers (I.V. Pogorelsky and I. Ben-Zvi, to be published in PAC97 proceedings.) opens up possibilities that the CBX source can be built with high average power $CO_2$ lasers (available for a power level greater than I KW) and with higher energy (25 MeV) electron storage rings that are naturally more stable. Longer laser wavelength also means that the accessible wavelength of the scattered photons may be extended to softer x-rays (between 1 nm to 10 nm) and even into the extreme ultraviolet (EUV) range (above 10 nm). On the other hand, by raising the electron energy in the storage ring, (no more than about a couple of hundred MeV due to the large energy spread induced by the laser electron beam interaction), hard x-rays with energy up to a few hundred KeV can be generated. The intensity of these x-rays can be orders of magnitude higher than other schemes based on Compton scattering because of the cooling and stability of this system. It is apparent that x-rays with increased intensity may be generated by introducing more than one electron bunch into the compact ring and adjusting the resonant cavity to maintain the timing so that a photon pulse interacts with each electron bunch. It is also apparent that the resonant optical cavity can store more than one photon pulse and that the phase of the electron pulses and photon pulses can be adjusted to coincide to obtain increased interaction and more intense x-rays. The invention may be carried out with a ring having multiple interaction regions, each associated with a resonant optical cavity to provide a number of x-ray beams.

Although the shape of the described storage ring is approximately elliptical, the storage ring can have other shapes with single or multiple interaction regions. The x-ray source based on a compact laser-electron storage ring may have many industrial and medical applications such as lithography, radiography, and angiography. The compact low emittance electron bunches may have other applications where low emmitance is required such as Free Electron Lasers. The low emittance, compact, intense electron bunch or bunches can be extracted from the storage ring by suitable magnetic or electrostatic fields to be used for such other applications.

What is claimed is:

1. A Compton backscatter x-ray source in which electrons interact with photons in an interaction region to generate x-rays comprising:

means for providing tightly focused photon pulses to said interaction region at a predetermined frequency; and a compact electron storage ring for storing and guiding bunched electrons around said ring and maintaining said bunched electrons in a, said storage ring directing said bunched electrons to said interaction region at said predetermined frequency, said bunched electrons being substantially the same size as said tightly focused laser pulses at the interaction region, whereby to provide enhanced interaction between the bunched electrons and the tightly focused photon pulses to effectively cool said bunched electrons and to enhance the x-ray flux.

2. A Compton backscatter x-ray source as in claim 1 in which said compact electron storage ring includes means at the entrance of said interaction region for focusing said bunched electrons to assure that the electron bunches are substantially the same size as the photon pulses.

3. A compact backscatter x-ray source as in claim 1 in which the energy of said bunched electrons at said interaction region is between about 5 MeV and 200 MeV.

4. A Compton backscatter x-ray source as in claim 1 including means for injecting an electron bunch into said storage ring.

5. A Compton backscatter x-ray source as in claims 1, 2, 3 or 4 in which said means for providing said tightly focused photon pulse comprises a reflective optical resonator in which said photon pulse resonates and a laser for injecting laser pulses into said optical resonator at said frequency to build up and maintain the intensity of said photon pulse.

6. A Compton backscatter x-ray source as in claim 5 in which said compact electron storage ring includes a plurality of FODO cells for guiding and maintaining said bunched electrons in a bunch.

7. A Compton backscatter x-ray source as in claim 5 in which said electron storage ring includes an rf. accelerating cavity for longitudinally focusing said electron bunch and restoring energy lost in the interaction process.

8. A Compton backscatter source as in claim 6 in which the FODO cells comprise permanent magnets.

9. A Compton backscatter source as in claim 6 in which the FODO cells comprise electromagnets.

10. A Compton backscatter x-ray source as in claims 1, 2, 3 or 4 including means for extracting bunched electrons from said storage ring.

11. A method for generating x-rays comprising the steps of forming and guiding at least one tightly bunched electron bunch into an interaction region, and generating at least one tightly focused photon pulse and directing it through said interaction region so that it collides nearly head-on with said tightly bunched electron bunch whereby the tightly bunched electron bunch is cooled.

* * * * *